(12) United States Patent
Zhong et al.

(10) Patent No.: US 8,581,647 B2
(45) Date of Patent: Nov. 12, 2013

(54) SYSTEM AND METHOD OF STABILIZING CHARGE PUMP NODE VOLTAGE LEVELS

(75) Inventors: Cheng Zhong, San Diego, CA (US); Swarna L. Navubothu, San Diego, CA (US); Nam V. Dang, San Diego, CA (US); Xiaohua Kong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 47 days.

(21) Appl. No.: 13/293,731

(22) Filed: Nov. 10, 2011

(65) Prior Publication Data

US 2013/0120040 A1 May 16, 2013

(51) Int. Cl.
*H03L 7/06* (2006.01)
(52) U.S. Cl.
USPC .......................................... 327/157; 327/148
(58) Field of Classification Search
USPC ................................................ 327/148, 157
See application file for complete search history.

(56) References Cited

U.S. PATENT DOCUMENTS

| | | | |
|---|---|---|---|
| 5,363,066 A * | 11/1994 | Chen et al. ....................... 331/17 |
| 5,736,903 A * | 4/1998 | Myers et al. ..................... 331/17 |
| 5,790,612 A * | 8/1998 | Chengson et al. ............ 375/373 |
| 6,278,332 B1 | 8/2001 | Nelson et al. |
| 6,445,211 B1 | 9/2002 | Saripella |
| 6,771,102 B2 * | 8/2004 | Abidin et al. .................. 327/157 |
| 7,109,804 B2 * | 9/2006 | Mader et al. ..................... 331/16 |
| 7,239,188 B1 * | 7/2007 | Xu et al. ......................... 327/156 |
| 7,317,345 B2 * | 1/2008 | Sanchez et al. ............... 327/527 |
| 7,492,197 B2 | 2/2009 | Lin et al. |
| 7,557,625 B1 | 7/2009 | Bazes |
| 7,639,089 B2 | 12/2009 | Lee |
| 7,902,888 B1 | 3/2011 | Mei et al. |
| 7,977,984 B1 * | 7/2011 | D'Souza et al. .............. 327/157 |
| 8,067,987 B2 * | 11/2011 | Sen et al. ........................... 331/2 |
| 8,193,843 B1 * | 6/2012 | Stegmeir ........................ 327/157 |
| 8,294,497 B2 * | 10/2012 | Jeffries et al. ................. 327/157 |
| 2003/0020526 A1 * | 1/2003 | Ingino, Jr. ..................... 327/157 |
| 2004/0041603 A1 * | 3/2004 | Abidin et al. ................. 327/157 |
| 2006/0197563 A1 * | 9/2006 | Sanchez et al. ............... 327/156 |
| 2013/0120040 A1 * | 5/2013 | Zhong et al. .................. 327/157 |

OTHER PUBLICATIONS

Sujatha, V. et al. "Phase-Locked Loop with High Stability Against Process Variation and Gain-Boosting Charge Pump for Current Matching Characteristics," European Journal of Scientific Research, vol. 46, No. 3, EuroJournals Publishing, Inc., 2010, pp. 431-442.
"Phase-Locked Loop Basics, PLL," http://www.altera.com/support/devices/p11_clock/basics/pll-basics.html, Altera Corporation, printed Aug. 30, 2011, 1 page.
International Search Report and Written Opinion—PCT/US2012/064723—ISA/EPO—Jul. 30, 2013.

\* cited by examiner

*Primary Examiner* — Adam Houston
(74) *Attorney, Agent, or Firm* — Sam Talpalatsky; Nicholas J. Pauley; Joseph Agusta (57) ABSTRACT

A method includes tracking a tuning voltage at a first circuit coupled to a first drain node of a first supply of a charge pump. The method also includes tracking the tuning voltage at a second circuit coupled to a second drain node of a second supply of the charge pump. The method further includes stabilizing a first voltage of the first drain node and a second voltage of the second drain node responsive to the tuning voltage.

20 Claims, 5 Drawing Sheets

SYSTEM AND METHOD OF STABILIZING CHARGE PUMP NODE VOLTAGE LEVELS

I. FIELD

The present disclosure is generally related to stabilizing charge pump node voltage levels.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

The circuitry within wireless telephones and other electronic devices may include phase-locked loops (PLLs) that generate an output signal whose phase, frequency, or both is "locked" to an input signal (e.g., a clock signal). For example, a phase-locked loop may include a voltage controlled oscillator (VCO) responsive to a charge pump. A phase detector may control the charge pump using "up" and "down" signals, which cause the charge pump to vary a tuning voltage provided to the VCO within a desired tuning range by switching between a charging and a discharging path. However, as designers reduce supply voltages in order to increase battery life of mobile devices, transistors of the charge pump may not have sufficient headroom (i.e. may not be deeply saturated). Accordingly, a "mismatch" may occur such that the on and off paths used to generate the tuning voltage are mismatched, leading to "charge-sharing" and injection effects on the tuning voltage. The mismatch may prompt designers to increase current to the charge pump or to alter the tuning range of the VCO. However, these approaches may increase power consumption or reduce performance of the mobile device.

III. SUMMARY

The overall performance and reliability of a PLL may be affected by a mismatch current in its charge pump. For example, if a current source provides current through a drain node to a first path of a charge pump and then switches to provide current through the drain node to a second path, the drain node voltage will change during the switching process if there is not enough headroom for the transistors in the charge pump. Lower supply voltages result in decreased headroom for the transistors in the charge pump. Due to reduced transistor headroom in the charge pump, the voltage of the drain node can change significantly during current path switching. This increasing voltage change causes increased charge sharing and injection on the tuning voltage supplied to a voltage controlled oscillator (VCO) of the PLL. In turn, this increases the charge pump mismatch current (e.g., the amount of current charging a capacitor that supplies the VCO versus the amount of current discharging the capacitor).

Systems and methods to track and stabilize the drain node voltages of a charge pump, such as a charge pump within a PLL, are disclosed. A tracking circuit may track a tuning voltage that is supplied to a voltage controlled oscillator (VCO) in the PLL. The tuning voltage may be tracked at the gate of a transistor associated with the tracking circuit. During tracking, as the tuning voltage increases (and approaches a first supply voltage), an n-type metal oxide semiconductor (NMOS) transistor associated with a first tracking circuit will turn on. Additionally, as the tuning voltage decreases (and approaches a second supply voltage), a p-type metal oxide semiconductor (PMOS) transistor associated with a second tracking circuit will turn on. When the NMOS transistor associated with the first tracking circuit turns on, the value of the tuning voltage will be tracked to stabilize the voltage of the drain node of the current source associated with the PMOS part of the charge pump. When the PMOS transistor associated with the second tracking circuit turns on, the value of the tuning voltage will be tracked to stabilize the voltage of the drain node of the current source associated with the NMOS part of the charge pump. During operation, the voltage of the each respective drain node will be stabilized during switching (e.g. at the value of the tuning voltage), thereby reducing charge sharing and injection issues at the charge pump of the PLL.

In a particular embodiment, a circuit includes a charging current path coupled to a first current source and to a capacitor. The charging current path includes a drain node of the first current source. The circuit also includes a discharge current path coupled to a second current source and to the capacitor. The discharge current path includes a drain node of the second current source. The circuit further includes a first tracking circuit coupled to the drain node of the first current source and a second tracking circuit coupled to the drain node of the second current source. The first tracking circuit selectively modifies to stabilize a voltage level of the drain node of the first current source in response to a tuning voltage signal. The second tracking circuit selectively modifies to stabilize a voltage level of the drain node of the second current source in response to the tuning voltage signal.

In another particular embodiment, a circuit includes a charging current path coupled to a first current source and to a capacitor. The charging current path includes a drain node of the first current source. The circuit also includes a discharge current path coupled to a second current source and to the capacitor. The discharge current path includes a drain node of the second current source. The circuit further includes means for tracking a tuning voltage and for stabilizing the drain node of the first current source and the drain node of the second current source.

In another particular embodiment, a method includes tracking a tuning voltage at a first circuit coupled to a first drain node of a first supply of a charge pump. The method also includes tracking the tuning voltage at a second circuit coupled to a second drain node of a second supply of the charge pump. The method further includes stabilizing a first voltage of the first drain node and a second voltage of the second drain node responsive to the tuning voltage.

One particular advantage provided by at least one of the disclosed embodiments is an ability to decrease a charge pump mismatch current caused by a reduced power supply voltage being applied to the charge pump. Other aspects, advantages, and features of the present disclosure will become apparent after review of the entire application, including the following sections: Brief Description of the Drawings, Detailed Description, and the Claims.

V. DETAILED DESCRIPTION

Figure 1:
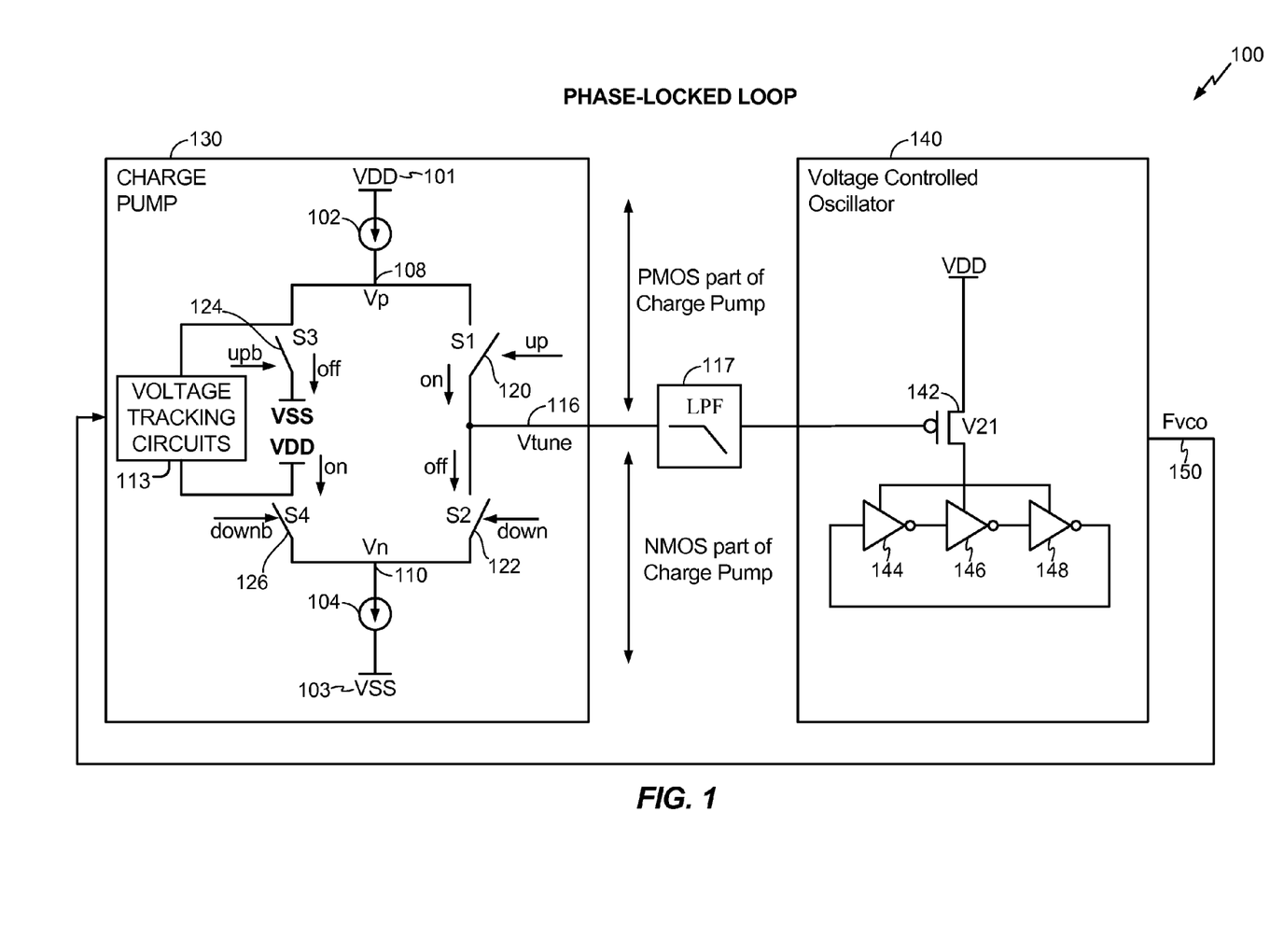
FIG. 1 is a block diagram of a particular illustrative embodiment of a phase-locked loop including a charge pump having voltage tracking circuits.

Referring to FIG. 1, a particular embodiment of a phase-locked loop 100 is shown. The phase-locked loop 100 includes a charge pump 130 coupled to a voltage controlled oscillator (VCO) 140. An output (Fvco) 150 of the voltage controlled oscillator 140 is provided to an input of the charge pump 130, forming a feedback path. The charge pump 130 has a PMOS portion and an NMOS portion. The charge pump 130 may be configured to generate a tuning voltage (Vtune) 116. The tuning voltage (Vtune) 116 is output by the charge pump 130 and is provided to the VCO 140 via a low pass loop filter 117. The voltage controlled oscillator 140 is responsive to the output of the low pass filter 117. The voltage controlled oscillator 140 is supplied by a voltage supply (VDD) and includes a transistor 142 and a plurality of serially coupled inverters 144, 146, and 148.

The charge pump 130 has a first voltage supply (VDD) 101 and a second voltage supply (VSS) 103. For example, the first voltage supply (VDD) 101 may be a positive supply voltage and the second voltage supply (VSS) 103 may be a negative supply voltage value or ground. A first current source 102 is coupled to the first voltage supply (VDD) 101 and has a first drain node (Vp) 108. A second current source 104 has a second drain node (Vn) 110 and is coupled to the second voltage supply (VSS) 103. The charge pump 130 also includes voltage tracking circuits 113. The voltage tracking circuits 113 are coupled to the first drain node (Vp) 108 and to the second drain node (Vn) 110. The voltage tracking circuits 113 selectively track the tuning voltage (Vtune) 116 to the first drain node (Vp) 108 and to the second drain node (Vn) 110 in order to stabilize the voltage at the drain nodes 108, 110. The charge pump 130 includes multiple switches including a first switch (S1) 120, a second switch (S2) 122, a third switch (S3) 124, and a fourth switch (S4) 126. The switches S1-S4 120-126 are responsive to up or down signals. For example, the first switch (S1) 120 is responsive to an up signal and the second switch (S2) 122 is responsive to a down signal. The third switch (S3) 124 is responsive to an up bar (upb) input and the fourth switch (S4) 126 is responsive to a down bar (downb) input. The up bar (upb) input is the opposite of the up signal and the down bar input is the opposite of the down signal. The output of the charge pump 130 (i.e., Vtune 116) is provided from a node between the first switch (S1) 120 and the second switch (S2) 122.

A charging current path is coupled to or includes the first current source 102 and includes the first drain node (Vp) 108 of the first current source 102. A discharge current path is coupled to or includes the second current source 104. The discharge current path includes the second drain node (Vn) 110 of the second current source 104. The charging path provides current to charge a capacitor (not shown in FIG. 1) that is coupled to an output of the charge pump 130. The discharge current path enables the capacitor (not shown) to discharge current via the discharge path.

The operation of the charging path and the discharge path is responsive to the up and down signals. For example, when the charging path is active the up signal is on and the down signal is off. In this situation, the first switch (S1) 120 is closed and the fourth switch (S4) 126 is also closed. With the first switch (S1) 120 closed, current flows from the first current source 102 via the output of the charge pump 130 to a capacitor to be charged. During a down cycle of the charge pump 130, the second switch (S2) 122 is closed and the third switch (S3) 124 is closed. With the discharge path enabled, charge from the capacitor flows through the second switch (S2) 122 and is drained by the second current source 104 to the second voltage supply (VSS) 103.

In an illustrative embodiment, when the PLL 100 is locked, the "on" path and the "off" path will be turned on alternatively during switching. As illustrated, the "on" path includes the first switch (S1) 120 and the fourth switch (S4) 126. The "off" path includes the second switch (S2) 122 and the third switch (S3) 124.

As illustrated, when the "on" path is active, the first switch (S1) 120 closes. The first current source 102 provides a current that flows through the current charging path and the first switch (S1) 120 and charges a capacitor (not shown) that is coupled to the output tuning voltage (Vtune) 116 of the charge pump 130. When the "on" path is active, the "off" path becomes inactive and the third switch (S3) 124 opens.

As illustrated, when the "off" path is active, the second switch (S2) 122 closes. The second current source 104 provides a current that flows from the capacitor (not shown) that is coupled to the output tuning voltage (Vtune) 116 of the charge pump 130 through the second switch (S2) 122 to the second voltage supply (VSS) 103 via the discharge current path. When the "off" path is active, the "on" path becomes inactive and the fourth switch (S4) 126 opens.

As illustrated, when the "off" path is active, the third switch (S3) 124 closes. The first current source 102 provides a current that flows through the third switch (S3) 124 to a second voltage supply (VSS). When the "off" path is active, the "on" path becomes inactive and the first switch (S1) 120 opens.

As illustrated, when the "on" path is active, the fourth switch (S4) 126 closes. The second current source 104 provides a current that flows from a first voltage supply (VDD) 101 through the fourth switch (S4) 126 and to the second voltage supply (VSS) 103. When the "on" path is active, the "off" path becomes inactive and the second switch (S2) 122 opens.

When the PLL 100 is locked, switching between an active "on" path and "off" path can change the voltage on the first drain node (Vp) 108 of the first current source 102 and can change the voltage on the second drain node (Vn) 110 of the second current source 104 if there is not enough headroom for the transistors in the charge pump 130. The voltage tracking circuits 113 are responsive to the tuning voltage signal (Vtune) 116 and stabilize the voltage of the first drain node (Vp) 108 of the first current source 102 at a voltage equivalent to or based on the tuning voltage (Vtune) 116 and stabilize the voltage of the second drain node (Vn) 110 of the second current source 104 at a voltage equivalent to or based on the tuning voltage (Vtune) 116. Stabilization may occur when the tuning voltage is high by applying the tuning voltage (Vtune) 116 to an NMOS transistor (not shown) of a first voltage tracking circuit, sinking the current from the NMOS transistor, and applying the drain voltage of the NMOS transistor to a PMOS transistor (not shown) of the first voltage tracking circuit. The voltage drop across the NMOS transistor will be equivalent to (or similar to) the voltage gain across the PMOS transistor so that the voltage of the first drain node 108 of the first current source 102 will be equal (or nearly equal) to the tuning voltage (Vtune) 116 minus the voltage drop across the NMOS transistor plus the voltage gain across the PMOS transistor (i.e. Vtune−Vdrop+Vgain=Vtune). Alternately, stabilization may occur when the tuning voltage is low by applying the tuning voltage (Vtune) 116 to a PMOS transistor (not shown) of a second voltage tracking circuit, sourcing the current from the PMOS transistor, and applying the drain voltage of the PMOS transistor to an NMOS transistor (not shown) of the second voltage tracking circuit. The voltage gain across the PMOS transistor will be equivalent to (or similar to) the voltage drop across the NMOS transistor so that the second drain node 110 of the second current source 104 will be equal to (or nearly equal) to the tuning voltage (Vtune) 116 plus the voltage gain across the PMOS transistor minus the voltage drop across the NMOS transistor (i.e. Vtune+Vgain−Vdrop=Vtune). As a result, during switching between the "on" and "off" paths, the voltage change at the first drain node (Vp) 108 and the voltage change at the second drain node (Vn) 110 may be substantially reduced as a result of being stabilized at a voltage level responsive to the tuning voltage signal (Vtune) 116.

Responsive to the tuning voltage signal (Vtune) 116, a first tracking circuit (not shown) of the voltage tracking circuits 113 selectively modifies to stabilize a voltage level of the first drain node (Vp) 108 of the first current source 102. Similarly, a second tracking circuit (not shown) of the voltage tracking circuits 113 selectively modifies to stabilize a voltage level of the second drain node (Vn) 110 of the second current source 104 in response to the tuning voltage signal (Vtune) 116.

It will be appreciated that stabilizing the voltage level of the first drain node (Vp) 108 and the voltage level of the second drain node (Vn) 110 during switching may decrease charge sharing and injection effects on the output tuning voltage (Vtune) 116 of the charge pump 130. Decreasing the charge sharing and injection effects during switching may decrease a mismatch current. That is, the amount of charging of a capacitor associated with the tuning voltage (Vtune) 116 during an up cycle may be equal to the amount of discharging of the capacitor associated with the tuning voltage (Vtune) 116 during a down cycle, which may decrease noise or allow for an increased voltage range in the PLL output 100.

Figure 2:
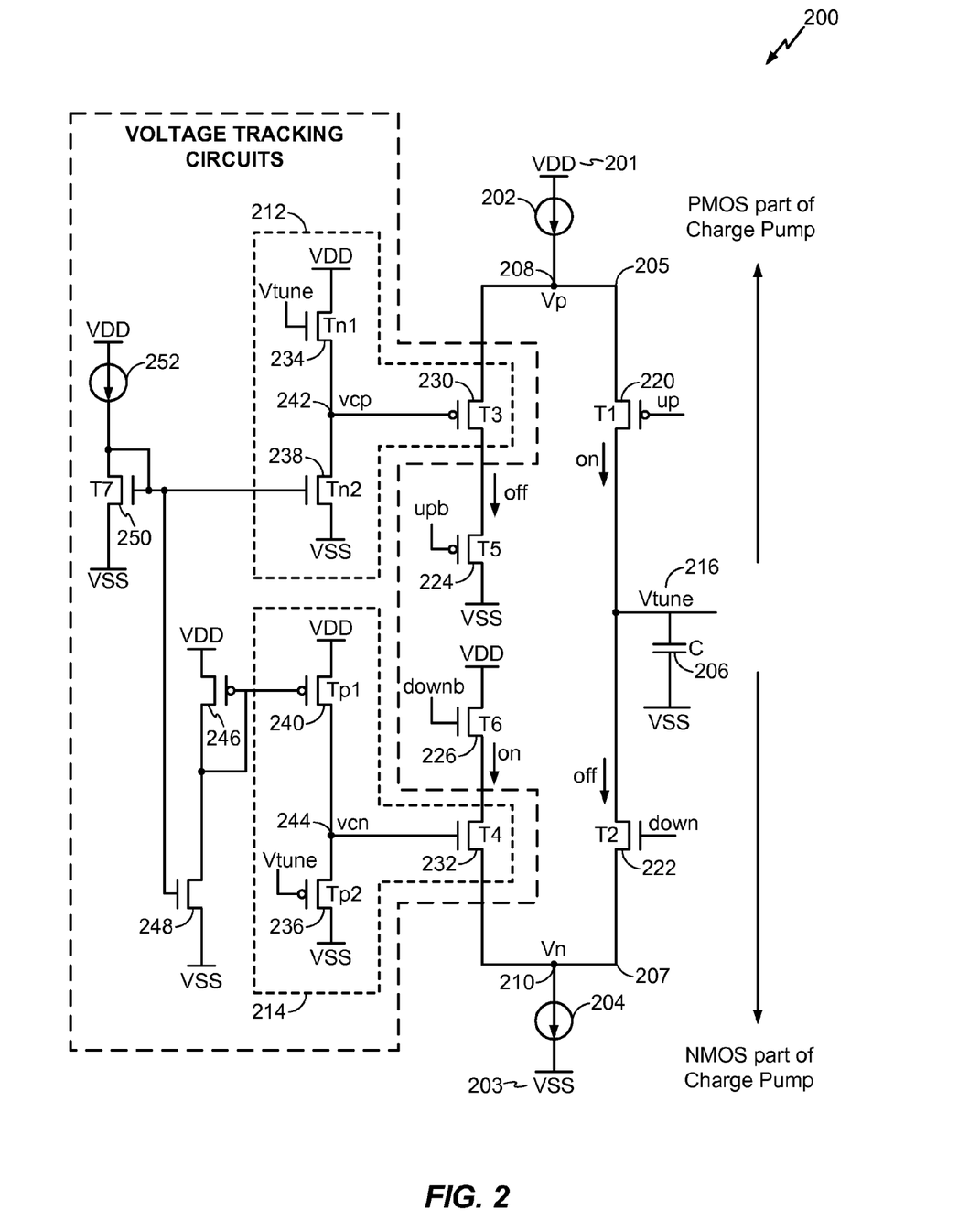
FIG. 2 is a circuit diagram of a particular illustrative embodiment of the charge pump and voltage tracking circuits of FIG. 1.

Referring to FIG. 2, a particular embodiment of a circuit 200 is shown. The circuit 200 includes a particular implementation of the charge pump 130 of the phase-locked loop 100 of FIG. 1. The circuit 200 has a first voltage supply (VDD) 201 and a second voltage supply (VSS) 203. The first voltage supply (VDD) 201 supplies a first current source 202 that has a first drain node (Vp) 208. A second current source 204 is coupled to the second voltage supply (VSS) 203 and is coupled to a second drain node (Vn) 210. A charging current path 205 is coupled to the first current source 202 and to a representative capacitor 206. The charging current path 205 includes the first drain node (Vp) 208 of the first current source 202. The circuit 200 includes a discharge current path 207 that is coupled to a second current source 204 and to the capacitor 206. The discharge current path 207 includes the second drain node (Vn) 210 of the second current source 204. In a particular embodiment, the charging current path 205 includes a first transistor (T1) 220, and the discharge current path 207 includes a second transistor (T2) 222. The first transistor (T1) 220 and the second transistor (T2) 222 may have substantially opposite characteristics. For example, the first transistor (T1) 220 may be a PMOS transistor and the second transistor (T2) 222 may be an NMOS transistor, as shown. Alternatively, in a complementary circuit, the first transistor (T1) 220 may be an NMOS transistor and the second transistor (T2) 222 may be a PMOS transistor.

The circuit 200 includes a first tracking circuit 212 and a second tracking circuit 214. The first tracking circuit 212 is coupled to the first drain node (Vp) 208 of the first current source 202. The second tracking circuit 214 is coupled to the second drain node (Vn) 210 of the second current source 204. The first tracking circuit 212 is responsive to a tuning voltage (Vtune) 216 and may include an NMOS transistor (Tn1) 234 and an NMOS transistor (Tn2) 238. The NMOS transistor (Tn1) 234 receives the tuning voltage (Vtune) 216 at its gate. The first tracking circuit 212 also includes a third transistor (T3) 230. An internal node (vcp) 242 is located between the NMOS transistor (Tn1) 234 and the NMOS transistor (Tn2) 238. The internal node (vcp) 242 is coupled to a gate of the third transistor (T3) 230. The third transistor (T3) 230 is coupled to the first drain node (Vp) 208 of the first source 202. The third transistor (T3) 230 is also coupled to a transistor (T5) 224, which is coupled to the second voltage supply (VSS) 203. The first tracking circuit 212 has an input (i.e. input to the transistor (Tn2) 238) that is responsive to the first supply voltage (VDD) 201 via a transistor (T7) 250.

The second tracking circuit 214 includes a PMOS transistor (Tp1) 240 and a PMOS transistor (Tp2) 236. The transistor (Tp2) 236 has a gate that receives the tuning voltage (Vtune) 216. The second tracking circuit 214 is responsive to circuitry including a PMOS transistor 246 coupled to the first voltage supply (VDD) 201 and an NMOS transistor 248 coupled to the second voltage supply (VSS) 203 as illustrated. The transistor 248 has a gate coupled to an output of the transistor (T7) 250. Thus, the transistor 248 receives an output of the transistor (T7) 250, and the NMOS transistor (Tn2) 238 of the first voltage tracking circuit 212 also receives the output of the transistor (T7) 250. The second tracking circuit 214 also includes a fourth transistor (T4) 232. The fourth transistor (T4) 232 is coupled to the second drain node (Vn) 210 of the second current source 204. The fourth transistor (T4) 232 is also coupled to a transistor (T6) 226 which is coupled to the first voltage supply (VDD) 201.

The first tracking circuit 212 is coupled to the first drain node (Vp) 208 of the first current source 202 by the third transistor (T3) 230. The third transistor (T3) 230 and the first transistor (T1) 220 have substantially similar characteristics. For example, the first transistor (T1) 220 and the third transistor (T3) 230 may both be PMOS transistors. The second tracking circuit 214 is coupled to the second drain node (Vn) 210 of the second current source 204 by the fourth transistor (T4) 232. The fourth transistor (T4) 232 and the second transistor (T2) 222 have substantially similar characteristics. For example, the second transistor (T2) 222 and the fourth transistor (T4) 232 may both be NMOS transistors. During operation, the first and second tracking circuits 212, 214 equalize the respective drain nodes 208 and 210 of the first current source 202 and the second current source 204 based on the tuning voltage (Vtune) 216. The tracking circuits 212, 214 are off, or provide little current, when the tuning voltage (Vtune) 216 is close to half of a supply voltage. For example, when the tuning voltage (Vtune) 216 is approximately half of the first supply voltage (VDD) 201, (e.g. between VDD and VSS when VSS is ground), the tracking circuits 212 and 214 do not affect (e.g. do not provide current or voltage to) the first or second drain nodes 208, 210.

When the tuning voltage (Vtune) 216 approaches the first voltage supply (VDD) 201, the first tracking circuit 212 tracks the tuning voltage (Vtune) 216 to the first drain node (Vp) 208 of the first current supply 202 to stabilize the voltage level of the first drain node (Vp) 208. Thus, the first tracking circuit 212 is configured to selectively modify to stabilize the voltage level of the first drain node (Vp) 208 in response to the tuning voltage signal (Vtune) 216. Similarly, as the tuning voltage (Vtune) 216 approaches the second supply voltage (VSS) 203, the second tracking circuit 214 tracks the tuning voltage (Vtune) 216 to the second drain node (Vn) 210 of the second current supply 204 in order to modify to stabilize the voltage level of the second drain node (Vn) 210. Thus, the second tracking circuit 214 is responsive to the tuning voltage (Vtune) 216 and selectively modifies to stabilize the voltage level of the second drain node (Vn) 210 of the second current source 204. In a particular embodiment, the voltage level of the first drain node (Vp) 208 of the first current source 202 is stabilized by keeping the third transistor (T3) 230 in a saturation region of operation. For example, during a charging cycle of the capacitor 206, as the tuning voltage (Vtune) 216 increases, the first tracking circuit 212 may place the third transistor (T3) 230 in a saturation region in order to stabilize the voltage level of the first drain node (Vp) 208 of the first current source 202. During a discharge cycle, when the capacitor 206 is discharged by the discharge current path, the second tracking circuit 214 may stabilize the second drain node (Vn) 210 of the second current source 204 by placing the fourth transistor (T4) 232 in a saturation region of operation.

Thus, the circuit 200 may include or may be part of a charge pump that is configured to generate the tuning voltage (Vtune) 216. The charge pump may have both a charging current path 205 that is coupled to the capacitor 206 and a discharge current path 207 that is coupled to the capacitor 206. The circuit 200 includes first and second voltage tracking circuits 212, 214 that selectively modify to stabilize a voltage level of the respective drain nodes 208, 210 in response to the tuning voltage signal (Vtune) 216.

During operation, by stabilizing the first drain node (Vp) 208 of the first current source 202 and the second drain node (Vn) 210 of the second current source 204, the first transistor (T1) 220 and the second transistor (T2) 222 are kept in a saturation region of operation. When the first transistor (T1) 220 and the second transistor (T2) 222 are kept in a saturation region of operation, current may more readily flow through the transistors, which may equalize the amount of current charging the capacitor (206) when the "on" path is active with the amount of current discharging from the capacitor (206) when the "off" path is active.

In an illustrative embodiment, the first tracking circuit 212 operates to track the tuning voltage signal (Vtune) 216 to stabilize the first drain node (Vp) 208 of the first current source 202. For example, if the tuning voltage (Vtune) 216 is high, the PMOS part of the charge pump (including the first transistor (T1) 220, the fifth transistor (T5), and the first drain node (Vp) 208) may have less headroom. In this scenario, the first tracking circuit 212 stabilizes the voltage on first drain node (Vp) 208.

For example, the high tuning voltage (Vtune) 216 will be applied to the gate of the NMOS transistor (Tn1) 234 of the first tracking circuit 212 to activate the NMOS transistor (Tn1) 234. The NMOS transistor (T7) 250 will sink current from the first voltage supply (VDD) 201 to the second voltage supply (VSS) 203 due to the drain-gate coupling as shown in FIG. 2. The NMOS transistor (Tn2) 238 mirrors the current from the NMOS transistor (T7) 250, sinking the mirrored current from node (vcp) 242 to the second supply voltage (VSS) 203. This causes the voltage level of node (vcp) 242 to be approximately the value of the tuning voltage (Vtune) 216 minus a threshold voltage drop associated with the NMOS transistor (Tn1) 234. Similarly, the mirrored current through the NMOS transistor (Tn2) 238 causes a voltage level at the first drain node (Vp) 208 to be approximately the value of the voltage level of node (vcp) 242 plus the voltage gain associated with a threshold voltage of the third transistor (T3) 230, which is a PMOS transistor. The voltage at the first drain node (Vp) 208 tracks the tuning voltage (Vtune) 216 and consequently tracks the voltage at the drain of the first transistor (T1) 220. By stabilizing the voltage level of the first drain node (Vp) 208 at approximately the value of the tuning voltage (Vtune) 216, both the first transistor (T1) 220 and the third transistor (T3) 230 will be in a saturated region of operation. As a result, a mismatch current will be reduced during switching between the "on" path and the "off" path since both the first transistor (T1) 220 and the third transistor (T3) 230 will be deeply saturated.

In a particular embodiment, if the tuning voltage (Vtune) 216 is high, the NMOS part of the charge pump (including the second transistor (T2) 222, the sixth transistor (T6) 226, and the second drain node (Vn) 210) will have more headroom for operation. This is turn negates the need for tracking the voltage of the second drain node (Vn) 210 to reduce the amount of mismatch current during switching between the "on" path and the "off" path when the tuning voltage (Vtune) 216 is at a high voltage. For example, a high tuning voltage (Vtune) 216 applied to the gate of the PMOS transistor (Tp2) 236 of the second tracking circuit 214 will turn off the PMOS transistor (Tp2) 236. Consequently, the NMOS transistor (T4) of the second tracking circuit 214 may operate as a switch and there may be no or little effect on the second drain node (Vn) 210 due to the second tracking circuit 214.

In an illustrative embodiment, the second tracking circuit 214 operates to track the tuning voltage signal (Vtune) 216 to the second drain node (Vn) 210 of the second current source 204. For example, if the tuning voltage (Vtune) 216 is low, the NMOS part of the charge pump (including the second transistor (T2) 222, the sixth transistor (T6) 226, and the second drain node (Vn) 210) will have less headroom. In this scenario, the second tracking circuit 214 stabilizes the voltage on the second drain node (Vn) 210.

For example, the low tuning voltage (Vtune) 216 will be applied to the gate of the PMOS transistor (Tp2) 236 of the second tracking circuit 214 to activate the PMOS transistor (Tp2) 236. The PMOS transistor 246 will source a current from the source of the NMOS transistor 248 to the first voltage supply (VDD) 201 due to the drain-gate coupling as shown in FIG. 2. The PMOS transistor (Tp1) 240 mirrors the current of the PMOS transistor 246, sourcing the mirrored current from node (vcn) 244 to the first supply voltage (VDD) 201. This causes the voltage level of node (vcn) 244 to be approximately the value of the tuning voltage (Vtune) 216 plus voltage gain associated with a threshold voltage of the PMOS transistor (Tp2) 236. Similarly, the mirrored current through the PMOS transistor (Tp1) 240 causes a voltage level at the second drain node (Vn) 210 to be approximately the value of the voltage level of node (vcn) 244 minus a threshold voltage drop associated with the fourth transistor (T4) 232, which is an NMOS transistor. The voltage at the second drain node (Vn) 210 now tracks the tuning voltage (Vtune) 216 and consequently tracks the voltage at the source of the second transistor (T2) 222. By stabilizing the voltage level of the second drain node (Vn) 210 at approximately the value of the tuning voltage (Vtune) 216, both the second transistor (T2) 222 and the fourth transistor (T4) 232 will be in a saturated region of operation. As a result, mismatch current will be reduced during switching between the "on" path and the "off" path since both the second transistor (T2) 222 and the fourth transistor (T4) 232 will be deeply saturated.

In a particular embodiment, if the tuning voltage (Vtune) 216 is low, the PMOS part of the charge pump (including the first transistor (T1) 220, the fifth transistor (T5), and the first drain node (Vp) 208) will have more headroom for operation. This is turn negates the need for tracking the voltage of the first drain node (Vp) 208 to reduce the amount of mismatch current during switching between the "on" path and the "off" path when the tuning voltage (Vtune) 216 is at a low voltage. For example, a low tuning voltage (Vtune) 216 applied to the gate of the NMOS transistor (Tn1) 234 of the first tracking circuit 212 will turn off the NMOS transistor (Tn1) 234. Consequently, the PMOS transistor (T3) 230 of the first tracking circuit 212 may operate as a switch and there may be no or little effect on the first drain node (Vp) 208 due to the first tracking circuit 212.

In an illustrative embodiment, the tracking circuits 212, 214 are off when the tuning voltage (Vtune) 216 is close to half (i.e. a medium tuning voltage) of the first voltage supply (VDD) 201. For this medium tuning voltage (Vtune) 216, both the NMOS part and the PMOS part of the charge pump have more headroom. In this scenario, the voltages on the first drain node (Vp) 208 of the first current source 202 and the voltage of the second drain node (Vn) 210 of the second current source 204 will experience minimal voltage change during switching between the "on" path and the "off" path. Thus, there is no need for the tracking circuits 212, 214 to stabilize the voltage level of the first drain node (Vp) 208 and the second drain node (Vn) 210 during this portion of the charge/discharge cycle.

For example, the medium tuning voltage (Vtune) 216 will be applied to the gate of the NMOS transistor (Tn1) 234 of the first tracking circuit 212. The medium tuning voltage (Vtune) 216 will turn off the NMOS transistor (Tn1) 234 and the third PMOS transistor (T3) 230 will operate as a switch in response. The medium tuning voltage (Vtune) 216 level will also be applied to the gate of the PMOS transistor (Tp2) 236 of the second tracking circuit 214. The medium tuning voltage (Vtune) 216 will turn off the PMOS transistor (Tp2) 236 and the fourth NMOS transistor (T4) will operate as a switch in response.

It will be appreciated that the first tracking circuit 212 may prevent the voltage level of the first drain node (Vp) 208 from changing between approximately the value of the tuning voltage (Vtune) 216 when the "on" path is active and the value of the second voltage supply (VSS) 203 when the "off" path is active. It will also be appreciated that the second tracking circuit 214 may prevent the voltage level of the second drain node (Vn) 210 from changing between approximately the value of the tuning voltage signal (Vtune) 216 when the "off" path is active and the first supply voltage (VDD) 201 when the "on" path is active.

It will be appreciated that stabilizing the voltage level of the first drain node (Vp) 208 and the voltage level of the second drain node (Vn) 210 during switching may decrease the charge sharing and injection effect of the charge pump. It will also be appreciated that decreasing the charge sharing and injection during switching may decrease the mismatch current. That is, the amount of current charging the capacitor 206 when the "on" path is active may be equal to the amount of current discharging the capacitor 206 when the "off" path is active, which may decrease the noise on the PLL output.

It will also be appreciated that stabilizing the voltage level of the first drain node (Vp) 208 may keep the first transistor (T1) 220 and the third transistor (T3) 230 in a deeply saturated region of operation during switching between an active "on" path and an active "off" path. Furthermore, it will be appreciated that stabilizing the voltage level of the second drain node (Vn) 210 may keep the second transistor (T2) 222 and the fourth transistor (T4) 232 in a deeply saturated region of operation during switching between an active "on" path and an active "off" path.

Figure 3:
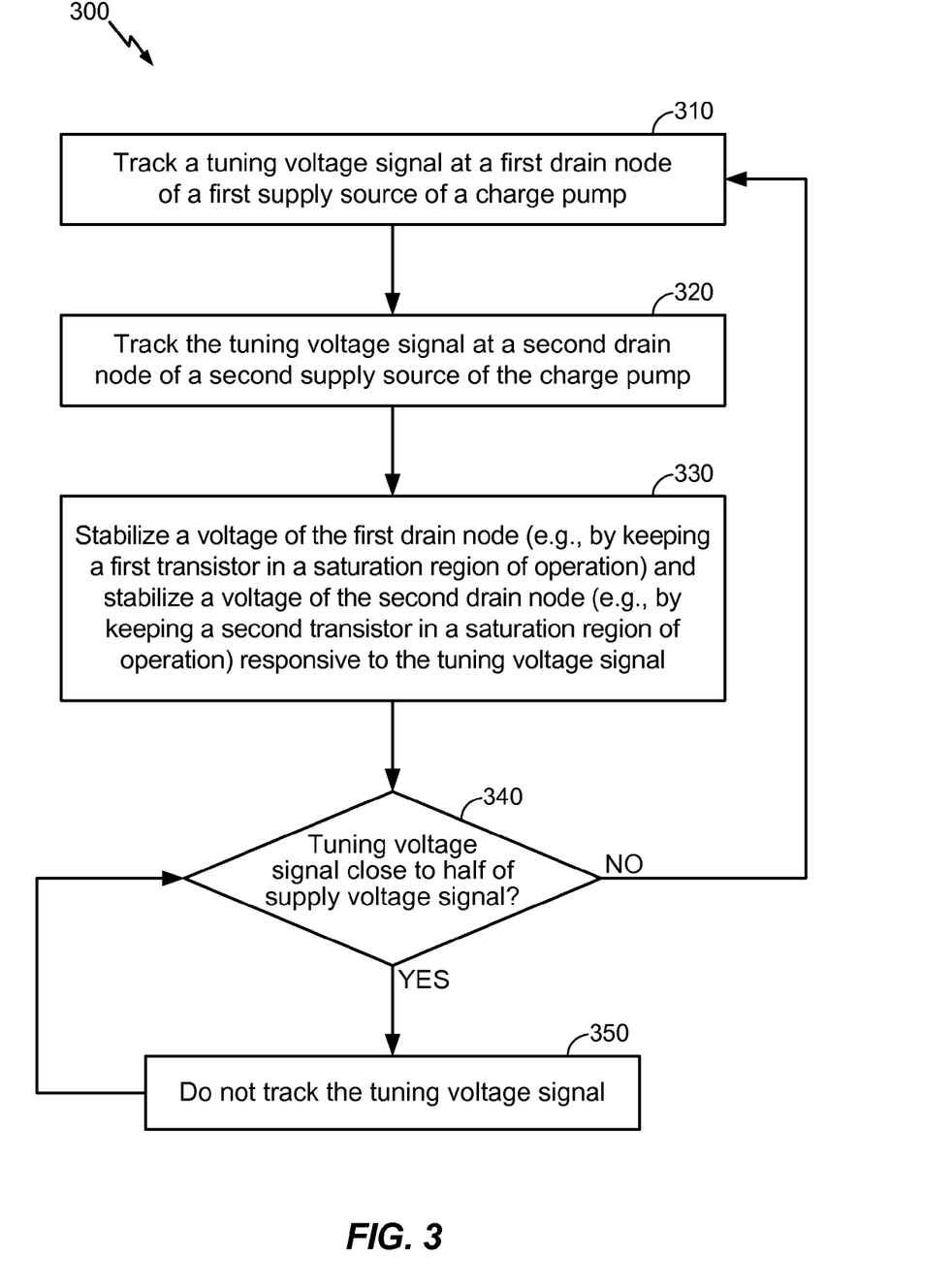
FIG. 3 is a flowchart to illustrate a particular embodiment of a method of stabilizing node voltage levels of a charge pump circuit, such as the circuits of FIG. 1 and FIG. 2.

Referring to FIG. 3, a particular embodiment of a method 300 of operating a circuit is shown. For example, the circuit may be the PLL 100 of FIG. 1 or the circuit 200 of FIG. 2. The method 300 includes tracking a tuning voltage signal at a first drain node of a first supply source of a charge pump, at 310. For example, in FIG. 2, the first voltage tracking circuit 212 may track the tuning voltage signal (Vtune) 216 at a first drain node (Vp) 208 of a first current supply source 202 of a charge pump. The method 300 further includes tracking the tuning voltage signal at a second drain node of a second supply source of the charge pump, at 320. For example, in FIG. 2, the second voltage tracking circuit 214 may track the tuning voltage signal (Vtune) 216 at the second drain node (Vn) 210 of the second current supply source 204 of the charge pump.

The method 300 further includes stabilizing a voltage of the first drain node and stabilizing a voltage of the second drain node responsive to the tuning voltage signal, at 330. The first drain node and the second drain node may be stabilized by keeping first and second transistors in a saturation region of operation. For example, in FIG. 2, the first voltage tracking circuit 212 may stabilize the first drain node (Vp) 208 by keeping the third transistor (T3) 230 in saturation, and the second voltage tracking circuit 214 may stabilize the second node (Vn) 210 responsive to changes in the tuning voltage signal (Vtune) 216 by keeping the fourth transistor (T4) 232 in saturation.

The method 300 further includes determining whether the tuning voltage signal is close to half of the supply voltage signal, at 340. When the tuning voltage signal is close to half of the supply voltage signal, then the tuning voltage signal is not tracked, at 350. For example, in FIG. 2, when the tuning voltage signal (Vtune) 216 is half of the supply voltage (VDD) 201 or halfway between the first supply voltage (VDD) 201 and the second supply voltage (VSS) 203, then the first and second tracking circuits 212, 214 do not provide current, or provide very little current to the first and second drain nodes 208, 210, respectively.

When the tuning voltage signal is not close to half of the supply voltage signal, the method 300 returns to 310 and continues tracking of the tuning voltage signal. For example, in FIG. 2, when the tuning voltage signal (Vtune) 216 is not close to half of the supply voltage (VDD) 201, or halfway between the first supply voltage (VDD) 201 and a second supply voltage (VSS) 203, then the first or second tracking circuits 212, 214 provide current to the first and second drain nodes 208, 210, respectively.

Figure 4:
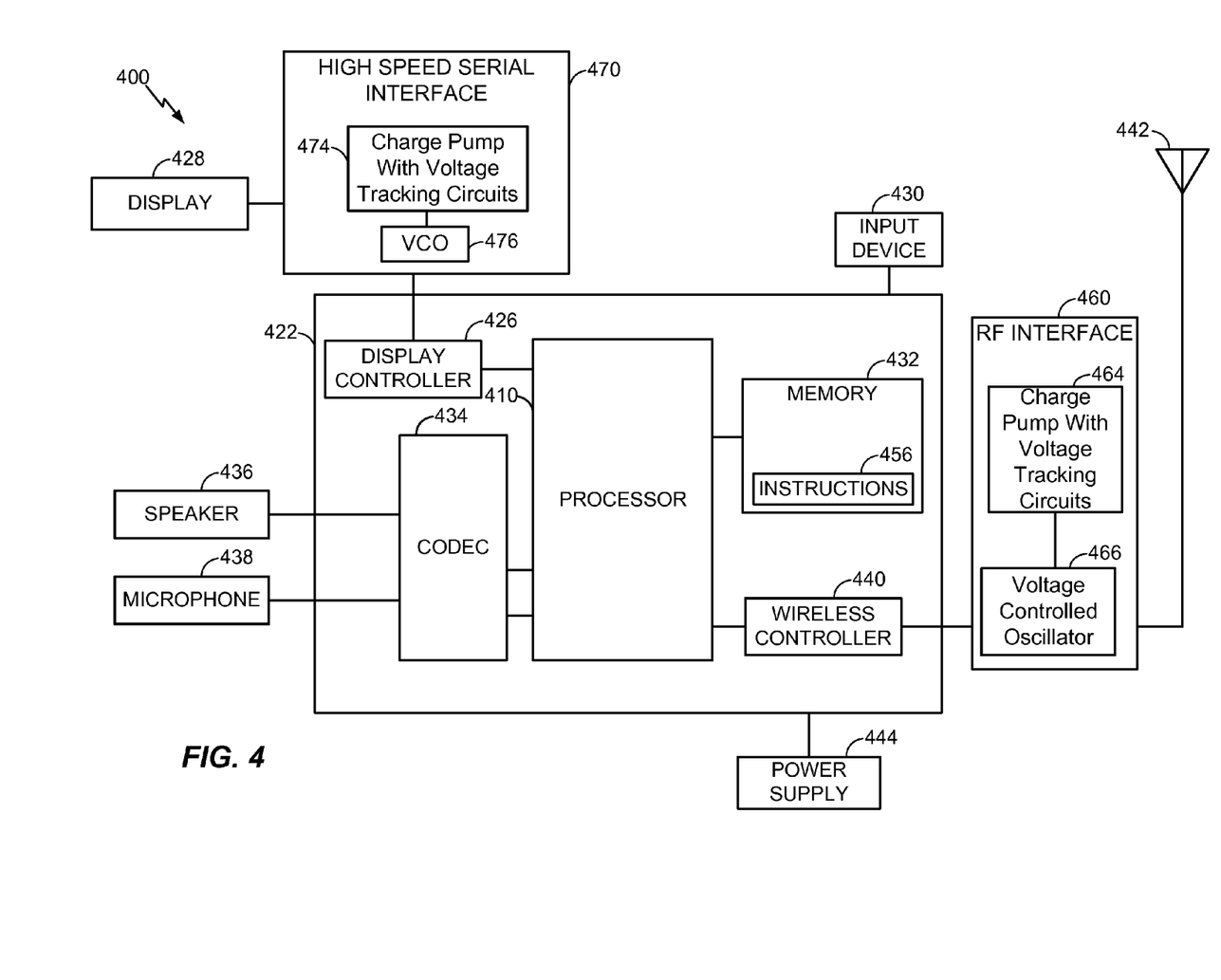
FIG. 4 is a block diagram of a wireless communication device including tracking circuits operable to stabilize node voltages of a charge pump.

Referring to FIG. 4, a block diagram of a particular illustrative embodiment of a wireless communication device is depicted and generally designated 400. The device 400 includes a processor, such as a digital signal processor (DSP) 410, coupled to a memory 432.

FIG. 4 also shows a display controller 426 that is coupled to the processor 410 and to a display 428. A coder/decoder (CODEC) 434 can also be coupled to the processor 410. A speaker 436 and a microphone 438 can be coupled to the CODEC 434. FIG. 4 also indicates that a wireless controller 440 can be coupled to the processor 410 and to a wireless antenna 442. In a particular embodiment, a radio frequency (RF) interface 460 disposed between the wireless controller 440 and the wireless antenna 442 includes a charge pump with voltage tracking circuits 464 coupled to a voltage controlled oscillator 466. In an illustrative embodiment, the charge pump with voltage tracking circuits 464 may include the charge pump 130 and the voltage tracking circuits 113 of FIG. 1, or the first voltage tracking circuit 212, the second voltage tracking circuit 214, and/or one or more other components of the circuit 200 of FIG. 2. The charge pump with voltage tracking circuits 464 may apply a tuning voltage to the voltage controlled oscillator 466, as described with reference to the tuning voltage signal 116 of FIG. 1 and the tuning voltage signal 216 of FIG. 2. In a particular embodiment, the charge pump with voltage tracking circuits 464 may perform the method 300 of FIG. 3.

In a particular embodiment, a display 428 is coupled to a display controller 426 via a high speed serial interface 470. The high speed serial interface 470 includes a charge pump with voltage tracking circuits 474 and a voltage controlled oscillator (VCO) 476. In an illustrative embodiment, the charge pump with voltage tracking circuits 476 may include the charge pump 130 and the voltage tracking circuits 113 of FIG. 1, or the first voltage tracking circuit 212, the second voltage tracking circuit 214, and/or one or more other components of the circuit 200 of FIG. 2. The charge pump with voltage tracking circuits 474 may apply a tuning voltage to the voltage controlled oscillator 476, as described with reference to the tuning voltage signal 116 of FIG. 1 and the tuning voltage signal 216 of FIG. 2. In a particular embodiment, the charge pump with voltage tracking circuits 474 may perform the method 300 of FIG. 3.

The memory 432 may be a tangible non-transitory processor-readable storage medium that includes executable instructions 456. The instructions 456 may be executed by the processor 410.

In a particular embodiment, the processor 410, the display controller 426, the memory 432, the CODEC 434, and the wireless controller 440 are included in a system-in-package or system-on-chip device 422. In a particular embodiment, an input device 430 and a power supply 444 are coupled to the system-on-chip device 422. Moreover, in a particular embodiment, as illustrated in FIG. 4, the display 428, the input device 430, the speaker 436, the microphone 438, the wireless antenna 442, and the power supply 444 are external to the system-on-chip device 422. However, each of the display 428, the input device 430, the speaker 436, the microphone 438, the wireless antenna 442, and the power supply 444 can be coupled to a component of the system-on-chip device 422, such as an interface or a controller. Although the high speed serial interface 470 is depicted as providing an interface for the display 428, in other embodiments the high speed serial interface 470 may provide an interface to one or more other components of the system-in-package or system-on-chip device 422.

In conjunction with the described embodiments, a circuit is disclosed that includes a charge pump with voltage tracking circuits and a voltage controlled oscillator. The circuit includes means for tracking a tuning voltage and for stabilizing a drain node of a first current source and a drain node of a second current source. For example, the means for tracking a tuning voltage and for stabilizing a drain node of a first current source and a drain node of a second current source may include the voltage tracking circuits 113 of FIG. 1, the first voltage tracking circuit 212 of FIG. 2, the second voltage tracking circuit 214 of FIG. 2, the charge pump with voltage tracking circuits 464, or a portion thereof, of FIG. 4, or one or more other devices, circuits, or modules to track a tuning voltage and stabilize a drain node of a first current source and a drain node of a second current source.

Figure 5:
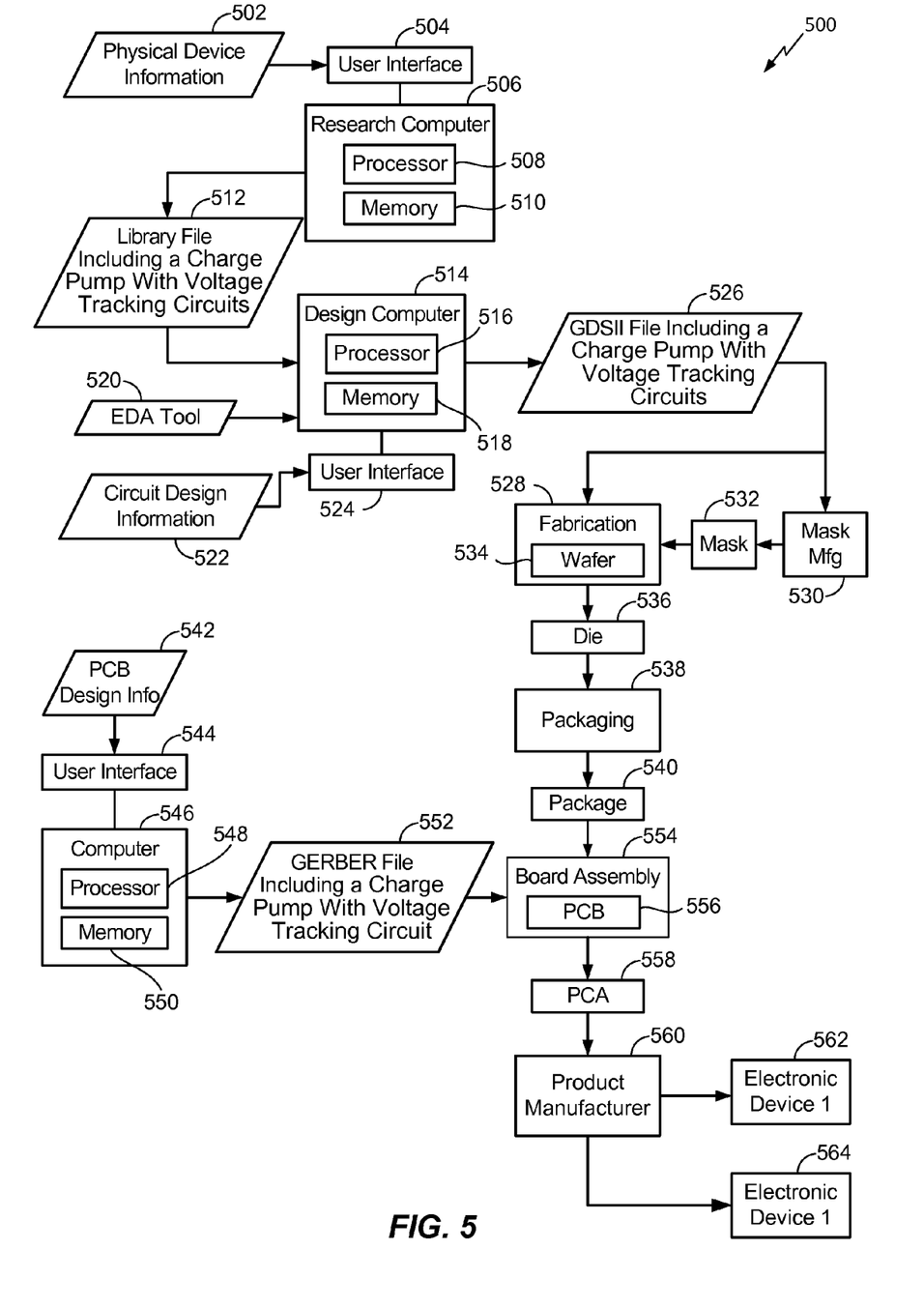
FIG. 5 is a data flow diagram of a particular illustrative embodiment of a manufacturing process to manufacture electronic devices that include tracking circuits operable to stabilize node voltages of a charge pump.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips may then be employed in devices, such as a set top box, a music player, a video player, an entertainment unit, a navigation device, a communications device, a personal digital assistant (PDA), a fixed location data unit, and a computer. FIG. 5 depicts a particular illustrative embodiment of an electronic device manufacturing process 500.

Physical device information 502 is received at the manufacturing process 500, such as at a research computer 506. The physical device information 502 may include design information representing at least one physical property of a semiconductor device, such as the charge pump 130 of FIG. 1 or components thereof, the voltage controlled oscillator 140 of FIG. 1 or components thereof, the voltage tracking circuits 113 of FIG. 1, the PLL 100 of FIG. 1 or components thereof, the first voltage tracking circuit 212 of FIG. 2 or components thereof, the second voltage tracking circuit 214 of FIG. 2 or components thereof, the circuit 200 of FIG. 2 or components thereof, the charge pump with voltage tracking circuits 464 of FIG. 4 or components thereof, the voltage controlled oscillator 466 of FIG. 4 or components thereof, or any combination thereof For example, the physical device information 502 may include physical parameters, material characteristics, and structure information that is entered via a user interface 504 coupled to the research computer 506. The research computer 506 includes a processor 508, such as one or more processing cores, coupled to a computer readable medium such as a memory 510. The memory 510 may store computer readable instructions that are executable to cause the processor 508 to transform the physical device information 502 to comply with a file format and to generate a library file 512.

In a particular embodiment, the library file 512 includes at least one data file including the transformed design information. For example, the library file 512 may include a library of semiconductor devices including a device that includes the charge pump 130 of FIG. 1 or components thereof, the voltage controlled oscillator 140 of FIG. 1 or components thereof, the voltage tracking circuits 113 of FIG. 1, the PLL 100 of FIG. 1 or components thereof, the first voltage tracking circuit 212 of FIG. 2 or components thereof, the second voltage tracking circuit 214 of FIG. 2 or components thereof, the circuit 200 of FIG. 2 or components thereof, the charge pump with voltage tracking circuits 464 of FIG. 4 or components thereof, the voltage controlled oscillator 466 of FIG. 4 or components thereof, or any combination thereof, that is provided for use with an electronic design automation (EDA) tool 520.

The library file 512 may be used in conjunction with the EDA tool 520 at a design computer 514 including a processor 516, such as one or more processing cores, coupled to a memory 518. The EDA tool 520 may be stored as processor executable instructions at the memory 518 to enable a user of the design computer 514 to design a circuit including the charge pump 130 of FIG. 1 or components thereof, the voltage controlled oscillator 140 of FIG. 1 or components thereof, the voltage tracking circuits 113 of FIG. 1, the PLL 100 of FIG. 1 or components thereof, the first voltage tracking circuit 212 of FIG. 2 or components thereof, the second voltage tracking circuit 214 of FIG. 2 or components thereof, the circuit 200 of FIG. 2 or components thereof, the charge pump with voltage tracking circuits 464 of FIG. 4 or components thereof, the voltage controlled oscillator 466 of FIG. 4 or components thereof, or any combination thereof, of the library file 512. For example, a user of the design computer 514 may enter circuit design information 522 via a user interface 524 coupled to the design computer 514. The circuit design information 522 may include design information representing at least one physical property of a semiconductor device, such as the charge pump 130 of FIG. 1 or components thereof, the voltage controlled oscillator 140 of FIG. 1 or components thereof, the voltage tracking circuits 113 of FIG. 1, the PLL 100 of FIG. 1 or components thereof, the first voltage tracking circuit 212 of FIG. 2 or components thereof, the second voltage tracking circuit 214 of FIG. 2 or components thereof, the circuit 200 of FIG. 2 or components thereof, the charge pump with voltage tracking circuits 464 of FIG. 4 or components thereof, the voltage controlled oscillator 466 of FIG. 4 or components thereof, or any combination thereof. To illustrate, the circuit design property may include identification of particular circuits and relationships to other elements in a circuit design, positioning information, feature size information, interconnection information, or other information representing a physical property of a semiconductor device.

The design computer 514 may be configured to transform the design information, including the circuit design information 522, to comply with a file format. To illustrate, the file formation may include a database binary file format representing planar geometric shapes, text labels, and other information about a circuit layout in a hierarchical format, such as a Graphic Data System (GDSII) file format. The design computer 514 may be configured to generate a data file including the transformed design information, such as a GDSII file 526 that includes information describing the charge pump 130 of FIG. 1 or components thereof, the voltage controlled oscillator 140 of FIG. 1 or components thereof, the voltage tracking circuits 113 of FIG. 1, the PLL 100 of FIG. 1 or components thereof, the first voltage tracking circuit 212 of FIG. 2 or components thereof, the second voltage tracking circuit 214 of FIG. 2 or components thereof, the circuit 200 of FIG. 2 or components thereof, the charge pump with voltage tracking circuits 464 of FIG. 4 or components thereof, the voltage controlled oscillator 466 of FIG. 4 or components thereof, or any combination thereof, in addition to other circuits or information. To illustrate, the data file may include information corresponding to a system-on-chip (SOC) that includes the charge pump 130 of FIG. 1 or components thereof, the voltage controlled oscillator 140 of FIG. 1 or components thereof, the voltage tracking circuits 113 of FIG. 1, the PLL 100 of FIG. 1 or components thereof, the first voltage tracking circuit 212 of FIG. 2 or components thereof, the second voltage tracking circuit 214 of FIG. 2 or components thereof, the circuit 200 of FIG. 2 or components thereof, the charge pump with voltage tracking circuits 464 of FIG. 4 or components thereof, the voltage controlled oscillator 466 of FIG. 4 or components thereof, or any combination thereof, and that also includes additional electronic circuits and components within the SOC.

The GDSII file 526 may be received at a fabrication process 528 to manufacture the charge pump 130 of FIG. 1 or components thereof, the voltage controlled oscillator 140 of FIG. 1 or components thereof, the voltage tracking circuits 113 of FIG. 1, the PLL 100 of FIG. 1 or components thereof, the first voltage tracking circuit 212 of FIG. 2 or components thereof, the second voltage tracking circuit 214 of FIG. 2 or components thereof, the circuit 200 of FIG. 2 or components thereof, the charge pump with voltage tracking circuits 464 of FIG. 4 or components thereof, the voltage controlled oscillator 466 of FIG. 4 or components thereof, or any combination thereof, according to transformed information in the GDSII file 526. For example, a device manufacture process may include providing the GDSII file 526 to a mask manufacturer 530 to create one or more masks, such as masks to be used with photolithography processing, illustrated as a representative mask 532. The mask 532 may be used during the fabrication process to generate one or more wafers 534, which may be tested and separated into dies, such as a representative die 536. The die 536 includes a circuit including a device that includes the charge pump 130 of FIG. 1 or components thereof, the voltage controlled oscillator 140 of FIG. 1 or components thereof, the voltage tracking circuits 113 of FIG. 1, the PLL 100 of FIG. 1 or components thereof, the first voltage tracking circuit 212 of FIG. 2 or components thereof, the second voltage tracking circuit 214 of FIG. 2 or components thereof, the circuit 200 of FIG. 2 or components thereof, the charge pump with voltage tracking circuits 464 of FIG. 4 or components thereof, the voltage controlled oscillator 466 of FIG. 4 or components thereof, or any combination thereof.

The die 536 may be provided to a packaging process 538 where the die 536 is incorporated into a representative package 540. For example, the package 640 may include the single die 536 or multiple dies, such as a system-in-package (SiP) arrangement. The package 540 may be configured to conform to one or more standards or specifications, such as Joint Electron Device Engineering Council (JEDEC) standards.

Information regarding the package 540 may be distributed to various product designers, such as via a component library stored at a computer 546. The computer 546 may include a processor 548, such as one or more processing cores, coupled to a memory 550. A printed circuit board (PCB) tool may be stored as processor executable instructions at the memory 550 to process PCB design information 542 received from a user of the computer 546 via a user interface 544. The PCB design information 542 may include physical positioning information of a packaged semiconductor device on a circuit board, the packaged semiconductor device corresponding to the package 540 including the charge pump 130 of FIG. 1 or components thereof, the voltage controlled oscillator 140 of FIG. 1 or components thereof, the voltage tracking circuits 113 of FIG. 1, the PLL 100 of FIG. 1 or components thereof, the first voltage tracking circuit 212 of FIG. 2 or components thereof, the second voltage tracking circuit 214 of FIG. 2 or components thereof, the circuit 200 of FIG. 2 or components thereof, the charge pump with voltage tracking circuits 464 of FIG. 4 or components thereof, the voltage controlled oscillator 466 of FIG. 4 or components thereof, or any combination thereof.

The computer 546 may be configured to transform the PCB design information 542 to generate a data file, such as a GERBER file 552 with data that includes physical positioning information of a packaged semiconductor device on a circuit board, as well as layout of electrical connections such as traces and vias, where the packaged semiconductor device corresponds to the package 540 including the charge pump 130 of FIG. 1 or components thereof, the voltage controlled oscillator 140 of FIG. 1 or components thereof, the voltage tracking circuits 113 of FIG. 1, the PLL 100 of FIG. 1 or components thereof, the first voltage tracking circuit 212 of FIG. 2 or components thereof, the second voltage tracking circuit 214 of FIG. 2 or components thereof, the circuit 200 of FIG. 2 or components thereof, the charge pump with voltage tracking circuits 464 of FIG. 4 or components thereof, the voltage controlled oscillator 466 of FIG. 4 or components thereof, or any combination thereof In other embodiments, the data file generated by the transformed PCB design information may have a format other than a GERBER format.

The GERBER file 552 may be received at a board assembly process 554 and used to create PCBs, such as a representative PCB 556, manufactured in accordance with the design information stored within the GERBER file 552. For example, the GERBER file 552 may be uploaded to one or more machines to perform various steps of a PCB production process. The PCB 556 may be populated with electronic components including the package 540 to form a representative printed circuit assembly (PCA) 658.

The PCA 558 may be received at a product manufacture process 560 and integrated into one or more electronic devices, such as a first representative electronic device 562 and a second representative electronic device 564. As an illustrative, non-limiting example, the first representative electronic device 562, the second representative electronic device 564, or both, may be selected from the group of a set top box, a music player, a video player, an entertainment unit, a navigation device, a communications device, a personal digital assistant (PDA), a fixed location data unit, and a computer, into which the charge pump 130 of FIG. 1 or components thereof, the voltage controlled oscillator 140 of FIG. 1 or components thereof, the voltage tracking circuits 113 of FIG. 1, the PLL 100 of FIG. 1 or components thereof, the first voltage tracking circuit 212 of FIG. 2 or components thereof, the second voltage tracking circuit 214 of FIG. 2 or components thereof, the circuit of 200 FIG. 2 or components thereof, the charge pump with voltage tracking circuits 464 of FIG. 4 or components thereof, the voltage controlled oscillator 466 of FIG. 4 or components thereof, or any combination thereof is integrated. As another illustrative, non-limiting example, one or more of the electronic devices 562 and 564 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 5 illustrates remote units according to teachings of the disclosure, the disclosure is not limited to these illustrated units. Embodiments of the disclosure may be suitably employed in any device which includes active integrated circuitry including memory and on-chip circuitry.

A device that includes the charge pump 130 of FIG. 1 or components thereof, the voltage controlled oscillator 140 of FIG. 1 or components thereof, the voltage tracking circuits 113 of FIG. 1, the PLL 100 of FIG. 1 or components thereof, the first voltage tracking circuit 212 of FIG. 2 or components thereof, the second voltage tracking circuit 214 of FIG. 2 or components thereof, the circuit 200 of FIG. 2 or components thereof, the charge pump with voltage tracking circuits 464 of FIG. 4 or components thereof, the voltage controlled oscillator 466 of FIG. 4 or components thereof, or any combination thereof, may be fabricated, processed, and incorporated into an electronic device, as described in the illustrative process 500. One or more aspects of the embodiments disclosed with respect to FIGS. 1-4 may be included at various processing stages, such as within the library file 512, the GDSII file 526, and the GERBER file 552, as well as stored at the memory 510 of the research computer 506, the memory 518 of the design computer 514, the memory 550 of the computer 546, the memory of one or more other computers or processors (not shown) used at the various stages, such as at the board assembly process 554, and also incorporated into one or more other physical embodiments such as the mask 532, the die 536, the package 540, the PCA 558, other products such as prototype circuits or devices (not shown), or any combination thereof Although various representative stages of production from a physical device design to a final product are depicted, in other embodiments fewer stages may be used or additional stages may be included. Similarly, the process 500 may be performed by a single entity or by one or more entities performing various stages of the process 500.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal In the alternative, the processor and the storage medium may reside as discrete components in a computing device or user terminal The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A circuit comprising:
    a charging current path coupled to a first current source and to a capacitor, the charging current path including a drain node of the first current source;
    a discharge current path coupled to a second current source and to the capacitor, the discharge current path including a drain node of the second current source;
    a first tracking circuit coupled to the drain node of the first current source; and a second tracking circuit coupled to the drain node of the second current source, wherein the first tracking circuit selectively modifies to stabilize a voltage level of the drain node of the first current source in response to a tuning voltage signal, and wherein the second tracking circuit selectively modifies to stabilize a voltage level of the drain node of the second current source in response to the tuning voltage signal.

2. The circuit of claim 1, wherein stabilizing the voltage level of the drain node of the first current source includes keeping a transistor in a saturation region of operation.

3. The circuit of claim 1, further comprising a controllable oscillator responsive to the tuning voltage.

4. The circuit of claim 3, further comprising a charge pump configured to generate the tuning voltage.

5. The circuit of claim 1, wherein the charging current path further includes a first transistor and the discharge current path further includes a second transistor, wherein the first transistor and the second transistor have substantially opposite characteristics.

6. The circuit of claim 5, wherein the first tracking circuit is coupled to the drain node of the first current source by a third transistor, wherein the third transistor and the first transistor have substantially similar characteristics.

7. The circuit of claim 5, wherein the second tracking circuit is coupled to the drain node of the second current source by a fourth transistor, wherein the fourth transistor and the second transistor have substantially similar characteristics.

8. The circuit of claim 1, further comprising a device selected from the group consisting of a set top box, a music player, a video player, an entertainment unit, a navigation device, a communications device, a personal digital assistant (PDA), a fixed location data unit, and a computer, into which the first tracking circuit and the second tracking circuit are integrated.

9. A circuit comprising:
a charging current path coupled to a first current source and to a capacitor, the charging current path including a drain node of the first current source;
a discharge current path coupled to a second current source and to the capacitor, the discharge current path including a drain node of the second current source; and
means for tracking a tuning voltage and for stabilizing the drain node of the first current source and the drain node of the second current source.

10. The circuit of claim 9, wherein the means for tracking includes:
a first tracking circuit coupled to the drain node of the first current source; and
a second tracking circuit coupled to the drain node of the second current source,
wherein the first tracking circuit selectively modifies to stabilize a voltage level of the drain node of the first current source in response to a tuning voltage signal, and wherein the second tracking circuit selectively modifies to stabilize a voltage level of the drain node of the second current source in response to the tuning voltage signal.

11. The circuit of claim 10, wherein the first tracking circuit equalizes the drain node of the first current source with the tuning voltage and the second tracking circuit equalizes the drain node of the second current source with the tuning voltage.

12. The circuit of claim 10, wherein the first and second tracking circuits are off when the tuning voltage is close to half of a supply voltage.

13. The circuit of claim 9, further comprising a controllable oscillator responsive to the tuning voltage, wherein the charging current path further includes a first transistor and the discharge current path further includes a second transistor, and wherein the first transistor and the second transistor have substantially opposite characteristics.

14. The circuit of claim 13, wherein the first tracking circuit is coupled to the drain node of the first current source by a third transistor, wherein the second tracking circuit is coupled to the drain node of the second current source by a fourth transistor, wherein the third transistor and the first transistor have substantially similar characteristics, and wherein the fourth transistor and the second transistor have substantially similar characteristics.

15. The circuit of claim 13, wherein stabilizing the drain node of the first current source and the drain node of the second current source includes keeping the first transistor and the second transistor in a saturation region of operation.

16. The circuit of claim 9, further comprising a device selected from the group consisting of a set top box, a music player, a video player, an entertainment unit, a navigation device, a communications device, a personal digital assistant (PDA), a fixed location data unit, and a computer, into which the charging current path and the discharge current path are integrated.

17. A method comprising:
tracking a tuning voltage at a first circuit coupled to a first drain node of a first supply of a charge pump;
tracking the tuning voltage at a second circuit coupled to a second drain node of a second supply of the charge pump; and
stabilizing a first voltage of the first drain node and a second voltage of the second drain node responsive to the tuning voltage.

18. The method of claim 17, wherein stabilizing the first voltage of the first drain node includes keeping a first transistor of the first circuit coupled to the first drain node in a saturation region of operation, and wherein stabilizing the second voltage of the second drain node includes keeping a second transistor of the second circuit coupled to the second drain node in a saturation region.

19. The method of claim 17, further comprising not tracking the tuning voltage signal when the tuning voltage signal is close to half of a supply voltage signal of the first supply.

20. The method of claim 17, wherein the first circuit and the second circuit are integrated into a device selected from the group consisting of a set top box, a music player, a video player, an entertainment unit, a navigation device, a communications device, a personal digital assistant (PDA), a fixed location data unit, and a computer.

* * * * *